(12) United States Patent
Rakitzis et al.

(10) Patent No.: US 9,305,666 B2
(45) Date of Patent: *Apr. 5, 2016

(54) PRIORITIZED REPAIR OF DATA STORAGE FAILURES

(71) Applicant: Igneous Systems, Inc., Seattle, WA (US)

(72) Inventors: Triantaphyllos Byron Rakitzis, Seattle, WA (US); Eric Michael Lemar, Seattle, WA (US); Jeffrey Douglas Hughes, Seattle, WA (US); Kiran V. Bhageshpur, Seattle, WA (US)

(73) Assignee: Igneous Systems, Inc., Seattle, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/792,539

(22) Filed: Jul. 6, 2015

(65) Prior Publication Data

US 2015/0325315 A1    Nov. 12, 2015

Related U.S. Application Data

(63) Continuation of application No. 14/272,303, filed on May 7, 2014, now Pat. No. 9,075,773.

(51) Int. Cl.
*G06F 11/00* (2006.01)
*G11C 29/00* (2006.01)
(Continued)

(52) U.S. Cl.
CPC .............. *G11C 29/70* (2013.01); *G06F 11/073* (2013.01); *G06F 11/0727* (2013.01); *G06F 11/0751* (2013.01); *G06F 11/0793* (2013.01); *G06F 11/1088* (2013.01); *G06F 11/1092* (2013.01);
(Continued)

(58) Field of Classification Search
CPC ............. G06F 11/2069; G06F 11/1092; G06F 11/1088; G06F 11/1076
See application file for complete search history.

(56) References Cited

U.S. PATENT DOCUMENTS 6,567,826 B1   5/2003   Fischer et al.
6,615,314 B1   9/2003   Higaki et al.
(Continued)

FOREIGN PATENT DOCUMENTS

WO    2014000434 A1    1/2014

OTHER PUBLICATIONS

Office Communication for U.S. Appl. No. 14/272,303 mailed on Dec. 22, 2014 (17 pages).
(Continued)

*Primary Examiner* — Philip Guyton
(74) *Attorney, Agent, or Firm* — John W. Branch; Lowe Graham Jones PLLC

(57) ABSTRACT

Embodiments are directed towards managing data storage that may experience a data failure. If a repair event is associated with a data storage failure, a new repair task may be generated and added to a task list. A priority value for each repair task in the task list may be determined based in part on the mean-time-to-data-loss (MTTDL) value associated with each repair task in the task list such that a lower MTTDL may indicate a higher priority value over a lower MTTDL. One or more repair tasks may be promoted to become active repair tasks based on the priority value the repair tasks such that the promoted repair tasks have a higher priority that than other repair tasks in the task list, if any. Each active repair task may be executed to repair one or more associated the storage failures.

26 Claims, 8 Drawing Sheets

(51) Int. Cl.
*G06F 11/20* (2006.01)
*G06F 11/10* (2006.01)
*G06F 11/07* (2006.01)

(52) U.S. Cl.
CPC ........ *G06F 11/2069* (2013.01); *G06F 11/2094* (2013.01)

(56) References Cited

U.S. PATENT DOCUMENTS

| | | |
|---|---|---|
| 6,647,514 B1 | 11/2003 | Umberger et al. |
| 7,020,587 B1 | 3/2006 | Di et al. |
| 7,305,579 B2 | 12/2007 | Williams |
| 7,451,344 B1 | 11/2008 | Rothberg |
| 8,006,128 B2 | 8/2011 | Olster |
| 8,140,914 B2 | 3/2012 | Murphy et al. |
| 8,438,420 B1 | 5/2013 | Dutch et al. |
| 8,452,819 B1 | 5/2013 | Sorenson, III et al. |
| 8,751,739 B1 | 6/2014 | Bjornsson |
| 8,751,861 B2 | 6/2014 | Nair et al. |
| 8,850,108 B1 | 9/2014 | Hayes et al. |
| 9,003,144 B1 | 4/2015 | Hayes et al. |
| 9,075,773 B1 * | 7/2015 | Rakitzis et al. |
| 9,087,012 B1 | 7/2015 | Hayes et al. |
| 2003/0007482 A1 | 1/2003 | Khello et al. |
| 2006/0015771 A1 | 1/2006 | Van Gundy et al. |
| 2006/0190683 A1 | 8/2006 | Takase |
| 2007/0083723 A1 | 4/2007 | Dey et al. |
| 2007/0220313 A1 | 9/2007 | Katsuragi et al. |
| 2008/0126844 A1 | 5/2008 | Morita et al. |
| 2009/0106578 A1 | 4/2009 | Dilman et al. |
| 2009/0172285 A1 | 7/2009 | Smith et al. |
| 2010/0306409 A1 | 12/2010 | Jansen et al. |
| 2010/0312875 A1 | 12/2010 | Wilerson et al. |
| 2011/0029809 A1 | 2/2011 | Dhuse et al. |
| 2011/0138124 A1 | 6/2011 | Hill et al. |
| 2011/0282936 A1 | 11/2011 | Chekhanovskiy et al. |
| 2011/0289378 A1 | 11/2011 | Grube et al. |
| 2012/0079317 A1 | 3/2012 | Nelogal et al. |
| 2012/0226871 A1 | 9/2012 | Cantin et al. |
| 2012/0303736 A1 | 11/2012 | Novotny et al. |
| 2012/0317254 A1 | 12/2012 | Chekhanovskiy et al. |
| 2013/0024723 A1 | 1/2013 | Govindasamy |
| 2013/0054913 A1 | 2/2013 | Maeda et al. |
| 2013/0073896 A1 | 3/2013 | Le Scouarnec |
| 2013/0166816 A1 | 6/2013 | Atkisson et al. |
| 2013/0275815 A1 | 10/2013 | De Keyser et al. |
| 2013/0286579 A1 | 10/2013 | De Spiegeleer et al. |
| 2013/0290775 A1 | 10/2013 | Tucek et al. |
| 2014/0101283 A1 | 4/2014 | Alnafoosi et al. |
| 2014/0337530 A1 | 11/2014 | Amishav et al. |
| 2014/0365819 A1 | 12/2014 | Cooper et al. |

OTHER PUBLICATIONS

Office Communication for U.S. Appl. No. 14/272,303 mailed on May 7, 2015 (7 pages).

International Search Report and Written Opinion for International Patent Application No. PCT/US2015/029215 mailed on Jul. 7, 2015 (9 pages).

Office Communication for U.S. Appl. No. 14/315,139 mailed on May 7, 2015 (15 pages).

Office Communication for U.S. Appl. No. 14/454,651 mailed on Apr. 24, 2015 (9 pages).

Office Communication for U.S. Appl. No. 14/550,466 mailed on Jun. 3, 2015 (5 pages).

Office Communication for U.S. Appl. No. 14/663,359 mailed on May 18, 2015 (11 pages).

Office Communication for U.S. Appl. No. 14/315,139 mailed on Sep. 4, 2014 (16 pages).

Office Communication for U.S. Appl. No. 14/315,139 mailed on Dec. 26, 2014 (15 pages).

Office Communication for U.S. Appl. No. 14/454,651 mailed Nov. 5, 2014 (7 pages).

Office Communication for U.S. Appl. No. 14/550,466 mailed Feb. 9, 2015 (13 pages).

Office Communication for U.S. Appl. No. 14/315,139 mailed on Aug. 27, 2015 (11 pages).

Office Communication for U.S. Appl. No. 14/663,359 mailed on Oct. 7, 2015 (14 pages).

International Search Report and Written Opinion received for International Application No. PCT/US2015/031397 mailed on Aug. 4, 2015, 9 pages.

Office Communication for U.S. Appl. No. 14/954,616 mailed on Feb. 5, 2016 (19 pages).

Office Communication for U.S. Appl. No. 14/663,359 mailed on Jan. 15, 2016 (9 pages).

* cited by examiner

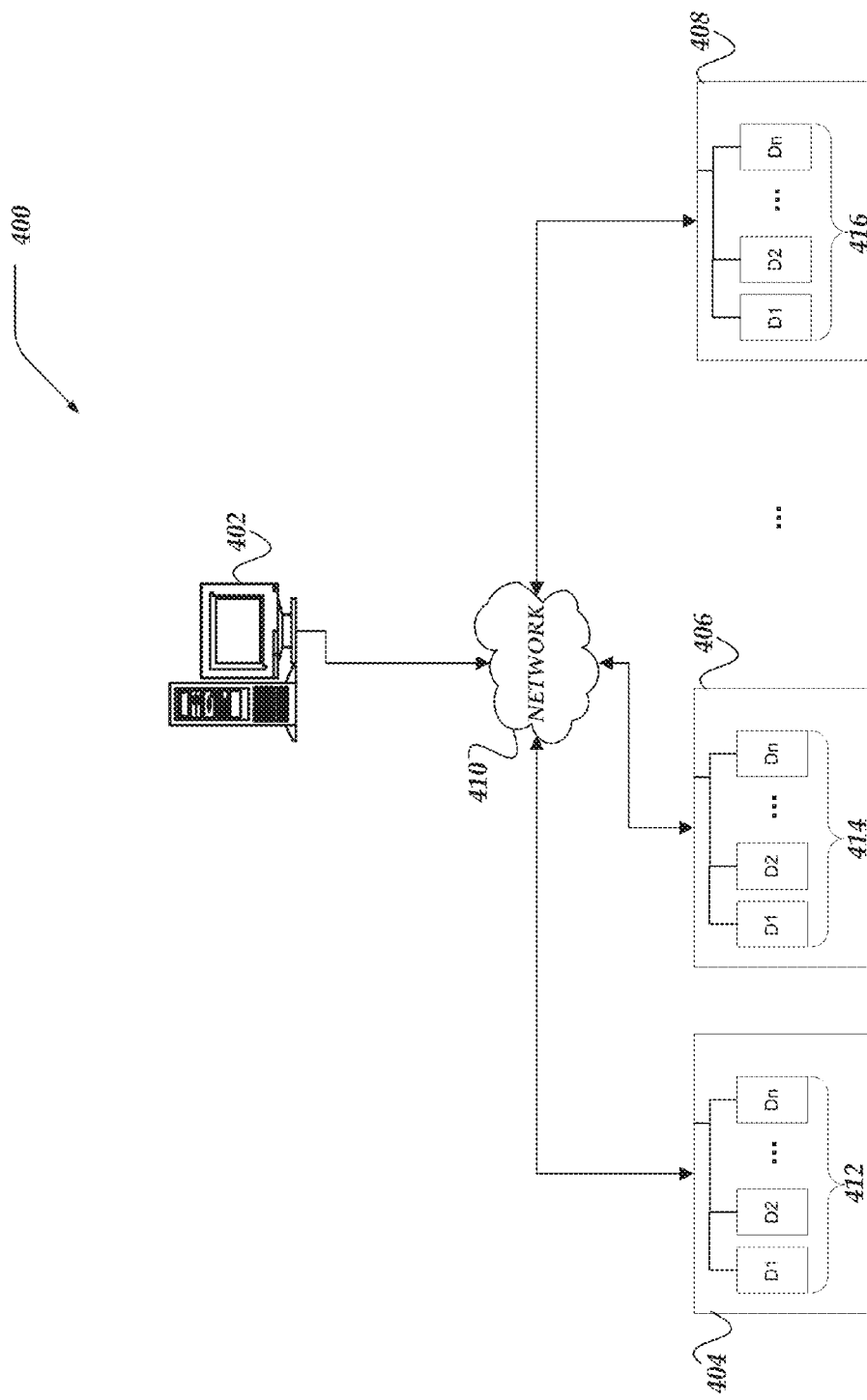

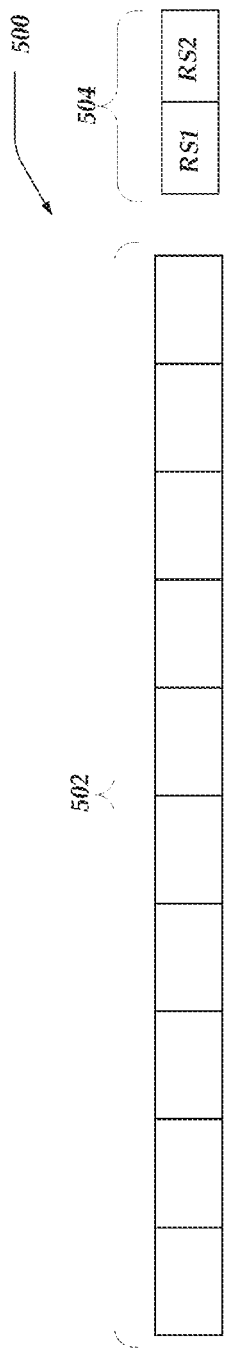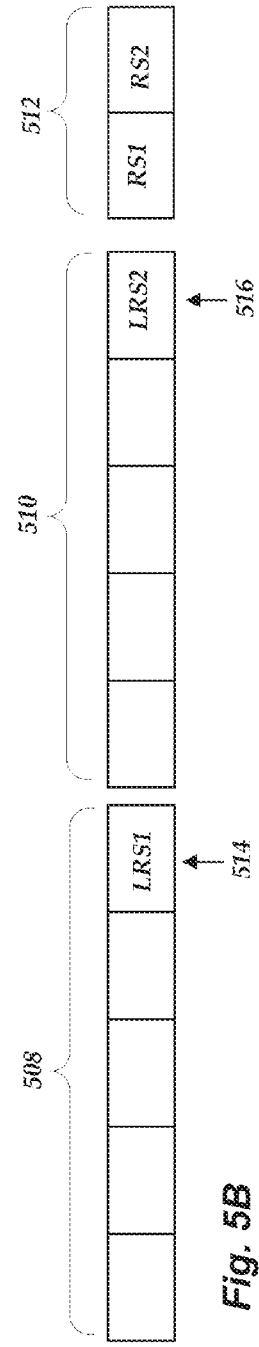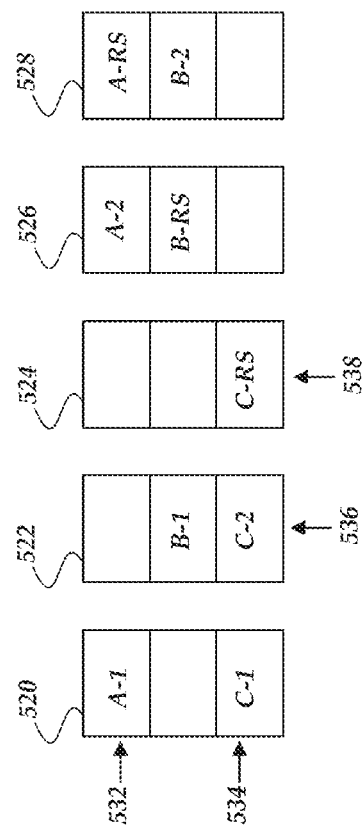
Fig. 5A
Fig. 5B
Fig. 5C

# PRIORITIZED REPAIR OF DATA STORAGE FAILURES

CROSS-REFERENCE TO RELATED APPLICATIONS

The present application is a Continuation of patent application Ser. No. 14/272,303, filed on May 7, 2014, issued as U.S. Pat. No. 9,075,773 on Jul. 7, 2015, entitled "PRIORITIZED REPAIR OF DATA STORAGE FAILURES", the benefit of the earlier filing date of which is hereby claimed under 35 U.S.C. §120 and 37 C.F.R. §1.78, and which is further incorporated by reference in its entirety.

TECHNICAL FIELD

This invention relates generally to managing data storage in a network, and more particularly, but not exclusively, to managing and controlling data repair and recovery in a data storage system.

BACKGROUND

The growth of the amount of data generated and retained by modern enterprises continues to increase. This explosion in data has led to larger and larger data storage systems. In some cases, these data storage systems may include thousands of storage devices. Unfortunately, as number of storage devices in a storage system increases the probability of storage device failure within a storage system increases as well. Accordingly, data storage systems may be arranged to employ error/data recovery techniques, such as, erasure coding for reducing the risk of data loss. A storage system may employ one or more data recovery techniques to restore data lost or corrupted due to storage device failure. However, as size of the data storage and the number of storage devices continues to increase, data restoration may increasingly take a disadvantageously long time to complete. Thus, it is with respect to these considerations and others that the invention has been made.

BRIEF DESCRIPTION OF THE DRAWINGS

FIG. 4 illustrates a portion of a data storage system for prioritized repair of storage failures in accordance with at least one of the various embodiments;

FIGS. 5A-5C illustrate portions of logical architecture of for data storage in accordance with at least one of the various embodiments;

DETAILED DESCRIPTION OF THE EMBODIMENTS

Figure 1:
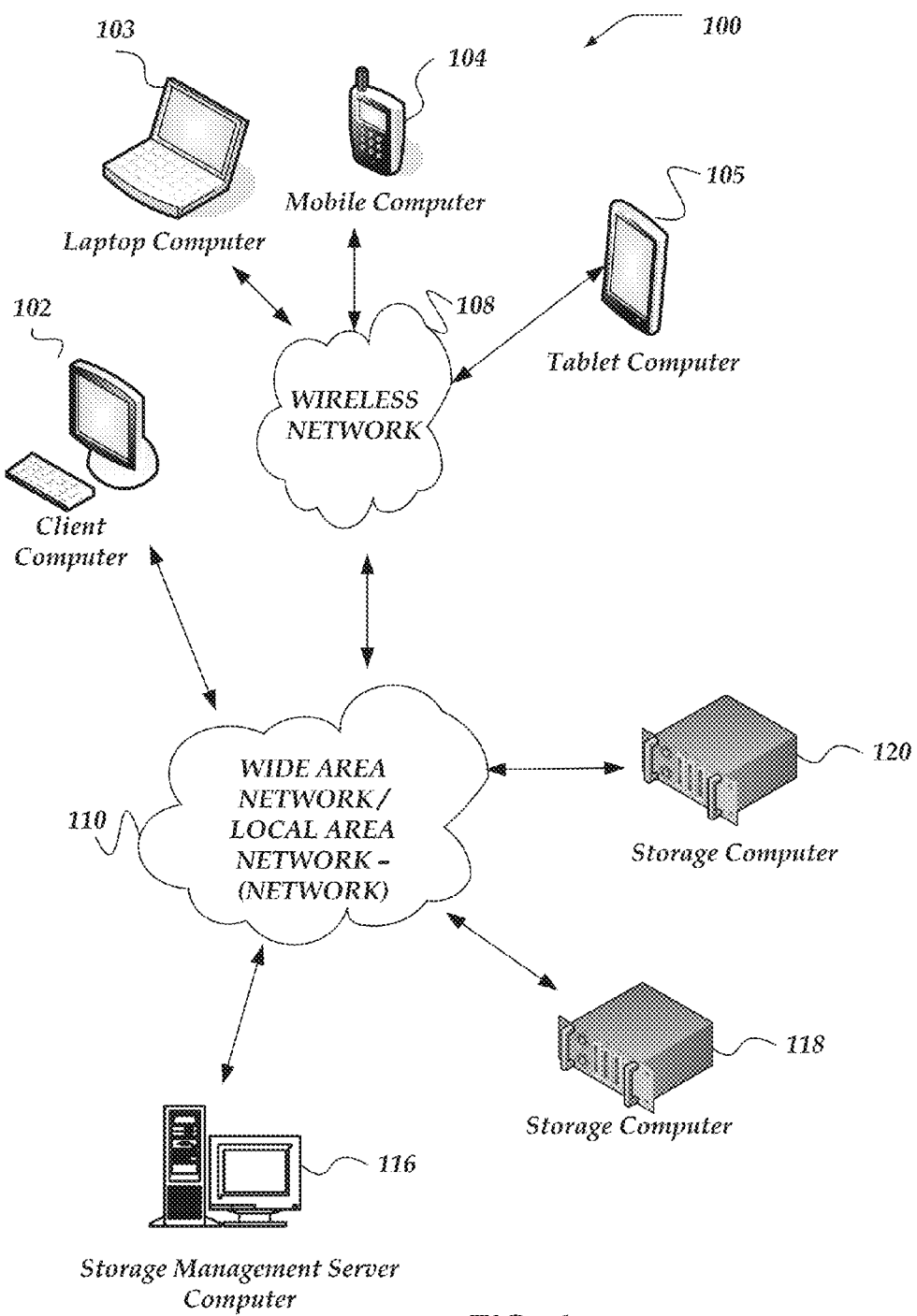
FIG. 1 illustrates a system environment in which various embodiments may be implemented.

Various embodiments now will be described more fully hereinafter with reference to the accompanying drawings, which form a part hereof, and which show, by way of illustration, specific exemplary embodiments by which the invention may be practiced. The embodiments may, however, be embodied in many different forms and should not be construed as limited to the embodiments set forth herein; rather, these embodiments are provided so that this disclosure will be thorough and complete, and will fully convey the scope of the embodiments to those skilled in the art. Among other things, the various embodiments may be methods, systems, media or devices. Accordingly, the various embodiments may take the form of an entirely hardware embodiment, an entirely software embodiment or an embodiment combining software and hardware aspects. The following detailed description is, therefore, not to be taken in a limiting sense.

Throughout the specification and claims, the following terms take the meanings explicitly associated herein, unless the context clearly dictates otherwise. The phrase "in one embodiment" as used herein does not necessarily refer to the same embodiment, though it may. Furthermore, the phrase "in another embodiment" as used herein does not necessarily refer to a different embodiment, although it may. Thus, as described below, various embodiments may be readily combined, without departing from the scope or spirit of the invention.

In addition, as used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. In addition, throughout the specification, the meaning of "a," "an," and "the" include plural references. The meaning of "in" includes "in" and "on."

For example embodiments, the following terms are also used herein according to the corresponding meaning, unless the context clearly dictates otherwise.

The term "storage device" as used herein refers to various apparatus for digital storing information, generally for use by computers. Storage devices may be fixed or removable non-volatile memory systems, such as, magnetic hard drives, magnetic tape, optical drives, solid state drives (SSD), flash memory storage, or the like. Typically, one or more storage devices may be arranged to store information for use in a computer system.

The term "storage computer" as used herein refers to a computer that is arranged to include one or more storage devices. In at least one of the various embodiments, a storage computer may include several storage devices inside a chassis. In other embodiments, the storage devices may be integrated with the storage computer.

The term "storage unit," or "storage block" as used herein refers to portions of the storage system that are dedicated to storing source data or source symbols that may be provided as input for erasure coding. Storing data in a storage unit does not imply a particular data format (e.g., compressed v. non-compressed, encrypted v. unencrypted). Data located in a storage unit may be used as source symbols for erasure-coding-based data protection.

The term "repair symbol unit," or "repair symbol block" as used herein refers to portions of the storage system that are dedicated to storing encoding symbols generated for erasure coding data protection. Accordingly, the data stored on repair symbol units is generated from source symbols that are stored on storage units or storage blocks.

The term "protection level" as used herein refers to the number of simultaneous data failures a storage system may experience before data may be irrevocably lost. In at least one of the various embodiments, protection level may be computed based on the amount of repair symbol information the storage system is storing for each storage unit. For example, if a storage system that employs erasure coding has ten hard drives for data storage and two hard drives for storing repair symbol information, under most arrangements the storage system would be considered to have a protection level of two.

The term "erasure coding" as used herein refers to methods for error correction/error recovery based on computing repair symbol information from storage information. The repair symbol information may be computed and stored separately from the storage information and may be employed to correct errors in the storage information that may be caused by data failure. Likewise, if the repair symbol information is lost because of a storage failure it may be recomputed from the storage information. One of ordinary skill in the art will be familiar with one or more well-known techniques for implementing erasure coding in a computer storage system. One or more well-known erasure coding algorithms may be employed for generating repair symbol information and recovery from data failure, such as, Reed-Solomon coding, XORing, Hamming codes, or the like. Various standard, non-standard, or custom, erasure coding systems may be used with the prioritized repair, non-limiting examples include, RAID 5 or RAID 6, or the like.

The terms "data failure," or "storage failure" as used herein refer to any system or device failure that causes data stored in a storage computer to be corrupted, lost, involuntarily deleted, or otherwise damaged such that the data is unreadable or involuntarily modified. For example, if a storage system includes 10 storage devices, the physical failure (breakdown) of one or more of the storage devices may be classified as a storage failure or data failure, since the information stored on the failed storage device may be inaccessible.

The term "repair" as used herein refers to actions performed to recover from one or more data failures in a storage system. If erasure coding is being employed, a repair may include reading repair symbol information and/or storage data from one or more storage devices and computing lost data using one or more erasure coding algorithms.

The term "repair event" as used herein refers to event that represents either the occurrence of new data failure in a storage system or a completion of a repair of a previous data failure to a portion of the storage system.

The term "repair task" as used herein refers to one or more actions directed towards repairing of a data failure. The particular actions corresponding to each repair task may vary depending on the organization and/or arrangement of the storage system, and/or the nature of the data failure. Repair tasks may be prioritized and/or queued until they are allocated resources to perform actions, or otherwise promoted to be an active repair task.

The term "active repair task" as used herein refers to a repair task that has been allocated repair resources and is actively performing actions as part of a repair. Repair tasks may be considered to be promoted to active repair tasks if they are enabled to perform actions.

The term "repair resource" as used herein refers to one or more storage system computing resources that may be required to execute a repair task when repairing the storage system. Repair resources may include, CPU processing, network bandwidth, local bandwidth, storage device throughput, or the like. For each repair task, a portion of some or all of the different kinds of repair resources may be required for the repair task to execute. Accordingly, repair resources sufficient for execution are allocated to the one or more repair tasks that are promoted to active repair tasks.

The term "data striping," and "data stripe" as used herein refers to the one or more methods segmenting logically sequential data, such as a file such that consecutive segments of the data may be stored on different storage devices. If erasure coding is used, the data from each storage unit block in a data strip may be employed to compute repair symbols for the data stripe and stored on a repair symbol block. Sometimes, data striping is referred to as disk striping.

The "resource budget" as used herein refers to a budget of available repair resources that may be allocated to active repair tasks. Resource budgets may be comprised values representing an amount of CPU processing, network bandwidth, local throughput, storage device throughput, or the like, that may be available for executing active repair tasks.

Briefly stated, various embodiments are directed towards managing data storage that may experience a data failure. Accordingly, in at least one of the various embodiments, responsive to the occurrence of one or more repair events various actions may be performed. In at least one of the various embodiments, if a repair event is associated with a new storage failure, one or more new repair tasks may be generated and added to a task list.

Alternatively, in at least one of the various embodiments, if the repair event indicates a completion of one or more active repair tasks, any associated repair tasks may be removed from the task list and any remaining repair tasks may be re-prioritized.

In at least one of the various embodiments, a priority value for each repair task in the task list may be determined based in part on the mean-time-to-data-loss (MTTDL) value associated with each repair task in the task list such that a lower MTTDL may indicate a higher priority value over a higher MTTDL. Further, in at least one of the various embodiments, the priority value for each repair task may be determined in part based on determining the duration for each repair task. Accordingly, in at least one of the various embodiments, repair tasks that have a longer duration may be prioritized over repair tasks with shorter durations. Also, in at least one of the various embodiments, the priority value for each repair task may be further determined based on the protection level of the data that may be associated with each repair task. Accordingly, in at least one of the various embodiments, repair tasks associated with data storage that may have a lower protection level may be prioritized over repair tasks associated with data storage having a higher protection level.

In at least one of the various embodiments, one or more repair tasks may be promoted to become active repair tasks based on the priority value of the repair tasks such that the promoted repair tasks have a higher priority that than other repair tasks in the task list, if any.

In at least one of the various embodiments, a portion of one or more repair resources may be allocated to each active repair task based at least on a resource budget that includes available repair resources. In at least one of the various embodiments, the resource budget may be determined based on the availability of various computing resources, such as, compute processing, network bandwidth, local bandwidth, storage device throughput, or the like.

In at least one of the various embodiments, if unallocated repair resources may be available and if at least one other repair task may be available to use the unallocated repair resources, that repair task may be promoted to an active repair task. Further, the unallocated repair resources may be allocated to the newly promoted active repair task for execution.

In at least one of the various embodiments, the execution of a current active repair task may be suspended and demoted back be being a repair task, if a repair task with a higher priority value than a priority value of the other active repair task is promoted to a active repair task and allocated repair resources currently allocated to the at least one other active repair task. In at least one of the various embodiments, each active repair task may be executed to repair their associated storage failures. In at least one of the various embodiments, the active repair task may be arranged to repair at least a portion of a data stripe that may be protected using erasure coding.

Illustrative Operating Environment

FIG. 1 shows components of one embodiment of an environment in which embodiments of the invention may be practiced. Not all of the components may be required to practice the invention, and variations in the arrangement and type of the components may be made without departing from the spirit or scope of the invention. As shown, system 100 of FIG. 1 includes local area networks (LANs)/wide area networks (WANs)—(network) 110, wireless network 108, client computers 102-105, Storage Management Server Computer 116, Storage Computer 118, Storage Computer 120, or the like.

At least one embodiment of client computers 102-105 is described in more detail below in conjunction with FIG. 2. In one embodiment, at least some of client computers 102-105 may operate over one or more wired and/or wireless networks, such as networks 108, and/or 110. Generally, client computers 102-105 may include virtually any computer capable of communicating over a network to send and receive information, perform various online activities, offline actions, or the like. In one embodiment, one or more of client computers 102-105 may be configured to operate within a business or other entity to perform a variety of services for the business or other entity. For example, client computers 102-105 may be configured to operate as a web server, firewall, client application, media player, mobile telephone, game console, desktop computer, or the like. However, client computers 102-105 are not constrained to these services and may also be employed, for example, as for end-user computing in other embodiments. It should be recognized that more or less client computers (as shown in FIG. 1) may be included within a system such as described herein, and embodiments are therefore not constrained by the number or type of client computers employed.

Computers that may operate as client computer 102 may include computers that typically connect using a wired or wireless communications medium such as personal computers, multiprocessor systems, microprocessor-based or programmable electronic devices, network PCs, or the like. In some embodiments, client computers 102-105 may include virtually any portable computer capable of connecting to another computer and receiving information such as, laptop computer 103, mobile computer 104, tablet computers 105, or the like. However, portable computers are not so limited and may also include other portable computers such as cellular telephones, display pagers, radio frequency (RF) devices, infrared (IR) devices, Personal Digital Assistants (PDAs), handheld computers, wearable computers, integrated devices combining one or more of the preceding computers, or the like. As such, client computers 102-105 typically range widely in terms of capabilities and features. Moreover, client computers 102-105 may access various computing applications, including a browser, or other web-based application.

A web-enabled client computer may include a browser application that is configured to receive and to send web pages, web-based messages, and the like. The browser application may be configured to receive and display graphics, text, multimedia, and the like, employing virtually any web-based language, including a wireless application protocol messages (WAP), and the like. In one embodiment, the browser application is enabled to employ Handheld Device Markup Language (HDML), Wireless Markup Language (WML), WMLScript, JavaScript, Standard Generalized Markup Language (SGML), HyperText Markup Language (HTML), eXtensible Markup Language (XML), JavaScript Object Notation (JSON), or the like, to display and send a message. In one embodiment, a user of the client computer may employ the browser application to perform various activities over a network (online) However, another application may also be used to perform various online activities.

Client computers 102-105 also may include at least one other client application that is configured to receive and/or send content between another computer. The client application may include a capability to send and/or receive content, or the like. The client application may further provide information that identifies itself, including a type, capability, name, and the like. In one embodiment, client computers 102-105 may uniquely identify themselves through any of a variety of mechanisms, including an Internet Protocol (IP) address, a phone number, Mobile Identification Number (MIN), an electronic serial number (ESN), or other device identifier. Such information may be provided in a network packet, or the like, sent between other client computers, storage management server computer 116, storage computer 118, storage computer 120, or other computers.

Client computers 102-105 may further be configured to include a client application that enables an end-user to log into an end-user account that may be managed by another computer, such as storage management server computer 116, storage computer 118, storage computer 120, or the like. Such an end-user account, in one non-limiting example, may be configured to enable the end-user to manage one or more online activities, including in one non-limiting example, project management, software development, configuration management, search activities, social networking activities, browse various websites, communicate with other users, or the like.

Wireless network 108 is configured to couple client computers 103-105 and its components with network 110. Wireless network 108 may include any of a variety of wireless sub-networks that may further overlay stand-alone ad-hoc networks, and the like, to provide an infrastructure-oriented connection for client computers 103-105. Such sub-networks may include mesh networks, Wireless LAN (WLAN) networks, cellular networks, and the like. In one embodiment, the system may include more than one wireless network.

Wireless network 108 may further include an autonomous system of terminals, gateways, routers, and the like connected by wireless radio links, and the like. These connectors may be configured to move freely and randomly and organize themselves arbitrarily, such that the topology of wireless network 108 may change rapidly.

Wireless network 108 may further employ a plurality of access technologies including 2nd (2G), 3rd (3G), 4th (4G) 5th (5G) generation radio access for cellular systems, WLAN, Wireless Router (WR) mesh, and the like. Access technologies such as 2G, 3G, 4G, 5G, and future access networks may enable wide area coverage for mobile computers, such as client computers 103-105 with various degrees of mobility. In one non-limiting example, wireless network 108 may enable a radio connection through a radio network access such as Global System for Mobil communication (GSM), General Packet Radio Services (GPRS), Enhanced Data GSM Environment (EDGE), code division multiple access (CDMA), time division multiple access (TDMA), Wideband Code Division Multiple Access (WCDMA), High Speed Downlink Packet Access (HSDPA), Long Term Evolution (LTE), and the like. In essence, wireless network 108 may include virtually any wireless communication mechanism by which information may travel between client computers 103-105 and another computer, network, a cloud-based network, a cloud instance, or the like.

Network 110 is configured to couple network computers with other computers, including, storage management server computer 116, storage computer 118, storage computer 120, client computers 102-105 through wireless network 108, or the like. Network 110 is enabled to employ any form of computer readable media for communicating information from one electronic device to another. Also, network 110 can include the Internet in addition to local area networks (LANs), wide area networks (WANs), direct connections, such as through a universal serial bus (USB) port, other forms of computer-readable media, or any combination thereof. On an interconnected set of LANs, including those based on differing architectures and protocols, a router acts as a link between LANs, enabling messages to be sent from one to another. In addition, communication links within LANs typically include twisted wire pair or coaxial cable, while communication links between networks may utilize analog telephone lines, full or fractional dedicated digital lines including T1, T2, T3, and T4, and/or other carrier mechanisms including, for example, E-carriers, Integrated Services Digital Networks (ISDNs), Digital Subscriber Lines (DSLs), wireless links including satellite links, or other communications links known to those skilled in the art. Moreover, communication links may further employ any of a variety of digital signaling technologies, including without limit, for example, DS-0, DS-1, DS-2, DS-3, DS-4, OC-3, OC-12, OC-48, or the like. Furthermore, remote computers and other related electronic devices could be remotely connected to either LANs or WANs via a modem and temporary telephone link. In one embodiment, network 110 may be configured to transport information of an Internet Protocol (IP).

Additionally, communication media typically embodies computer readable instructions, data structures, program modules, or other transport mechanism and includes any information delivery media. By way of example, communication media includes wired media such as twisted pair, coaxial cable, fiber optics, wave guides, and other wired media and wireless media such as acoustic, RF, infrared, and other wireless media.

One embodiment of storage management server computer 116 is described in more detail below in conjunction with FIG. 3. Briefly, however, storage management server computer 116 includes virtually any network computer capable of managing data storage in network environment for one or more applications or services.

Although FIG. 1 illustrates storage management server computer 116, storage computer 118, storage computer 120 each as a single computer, the innovations and/or embodiments are not so limited. For example, one or more functions of storage management server computer 116, storage computer 118, storage computer 120, or the like, may be distributed across one or more distinct network computers. Moreover, storage management server computer 116, storage computer 118, storage computer 120 are not limited to a particular configuration such as the one shown in FIG. 1. Thus, in one embodiment, storage management server computer 116, storage computer 118, or storage computer 120 may be implemented using a plurality of network computers. In other embodiments, server computer may operate as a plurality of network computers within a cluster architecture, a peer-to-peer architecture, or the like. Further, in at least one of the various embodiments, storage management server computer 116, storage computer 118, or storage computer 120 may be implemented using one or more cloud instances in one or more cloud networks.

Also, in at least one of the various embodiments, one or more storage management server computer, or at least some or all of the features thereof, may be incorporated in a storage computer, such as, storage computer 118, or storage computer 120. Accordingly, these innovations and embodiments are not to be construed as being limited to a single environment, and other configurations, and architectures are also envisaged.

Illustrative Client Computer

Figure 2:
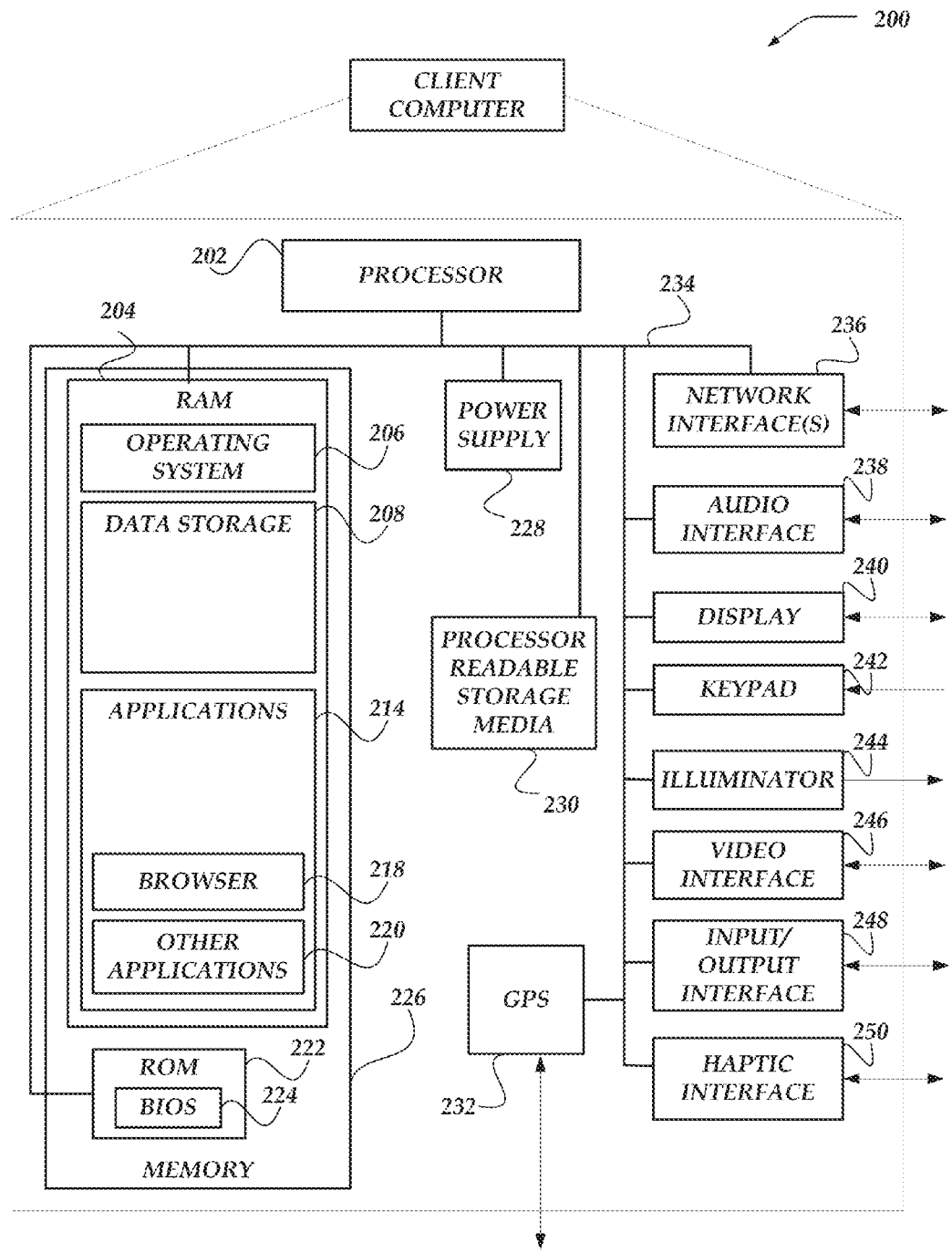
FIG. 2 shows a logical schematic embodiment of a client computer.

FIG. 2 shows one embodiment of client computer 200 that may be included in a system in accordance with at least one of the various embodiments. Client computer 200 may include many more or less components than those shown in FIG. 2. However, the components shown are sufficient to disclose an illustrative embodiment for practicing the present invention. Client computer 200 may represent, for example, one embodiment of at least one of client computers 102-105 of FIG. 1.

As shown in the figure, client computer 200 includes a processor 202 in communication with a mass memory 226 via a bus 234. In some embodiments, processor 202 may include one or more central processing units (CPU). Client computer 200 also includes a power supply 228, one or more network interfaces 236, an audio interface 238, a display 240, a keypad 242, an illuminator 244, a video interface 246, an input/output interface 248, a haptic interface 250, and a global positioning system (GPS) receiver 232.

Power supply 228 provides power to client computer 200. A rechargeable or non-rechargeable battery may be used to provide power. The power may also be provided by an external power source, such as an alternating current (AC) adapter or a powered docking cradle that supplements and/or recharges a battery.

Client computer 200 may optionally communicate with a base station (not shown), or directly with another computer. Network interface 236 includes circuitry for coupling client computer 200 to one or more networks, and is constructed for use with one or more communication protocols and technologies including, but not limited to, GSM, CDMA, TDMA, GPRS, EDGE, WCDMA, HSDPA, LTE, user datagram protocol (UDP), transmission control protocol/Internet protocol (TCP/IP), short message service (SMS), WAP, ultra wide band (UWB), IEEE 802.16 Worldwide Interoperability for Microwave Access (WiMax), session initiated protocol/real-time transport protocol (SIP/RTP), or any of a variety of other wireless communication protocols. Network interface 236 is sometimes known as a transceiver, transceiving device, or network interface card (NIC).

Audio interface 238 is arranged to produce and receive audio signals such as the sound of a human voice. For example, audio interface 238 may be coupled to a speaker and microphone (not shown) to enable telecommunication with others and/or generate an audio acknowledgement for some action.

Display 240 may be a liquid crystal display (LCD), gas plasma, light emitting diode (LED), organic LED, or any other type of display used with a computer. Display 240 may also include a touch sensitive screen arranged to receive input from an object such as a stylus or a digit from a human hand.

Keypad 242 may comprise any input device arranged to receive input from a user. For example, keypad 242 may include a push button numeric dial, or a keyboard. Keypad 242 may also include command buttons that are associated with selecting and sending images.

Illuminator 244 may provide a status indication and/or provide light. Illuminator 244 may remain active for specific periods of time or in response to events. For example, when illuminator 244 is active, it may backlight the buttons on keypad 242 and stay on while the client computer is powered. Also, illuminator 244 may backlight these buttons in various patterns when particular actions are performed, such as dialing another client computer. Illuminator 244 may also cause light sources positioned within a transparent or translucent case of the client computer to illuminate in response to actions.

Video interface 246 is arranged to capture video images, such as a still photo, a video segment, an infrared video, or the like. For example, video interface 246 may be coupled to a digital video camera, a web-camera, or the like. Video interface 246 may comprise a lens, an image sensor, and other electronics. Image sensors may include a complementary metal-oxide-semiconductor (CMOS) integrated circuit, charge-coupled device (CCD), or any other integrated circuit for sensing light.

Client computer 200 also comprises input/output interface 248 for communicating with external devices, such as a headset, or other input or output devices not shown in FIG. 2. Input/output interface 248 can utilize one or more communication technologies, such as USB, infrared, Bluetooth™, or the like.

Haptic interface 250 is arranged to provide tactile feedback to a user of the client computer. For example, the haptic interface 250 may be employed to vibrate client computer 200 in a particular way when another user of a computer is calling. In some embodiments, haptic interface 250 may be optional.

Client computer 200 may also include GPS transceiver 232 to determine the physical coordinates of client computer 200 on the surface of the Earth. GPS transceiver 232, in some embodiments, may be optional. GPS transceiver 232 typically outputs a location as latitude and longitude values. However, GPS transceiver 232 can also employ other geo-positioning mechanisms, including, but not limited to, triangulation, assisted GPS (AGPS), Enhanced Observed Time Difference (E-OTD), Cell Identifier (CI), Service Area Identifier (SAI), Enhanced Timing Advance (ETA), Base Station Subsystem (BSS), or the like, to further determine the physical location of client computer 200 on the surface of the Earth. It is understood that under different conditions, GPS transceiver 232 can determine a physical location within millimeters for client computer 200; and in other cases, the determined physical location may be less precise, such as within a meter or significantly greater distances. In one embodiment, however, client computer 200 may through other components, provide other information that may be employed to determine a physical location of the computer, including for example, a Media Access Control (MAC) address, IP address, or the like.

Mass memory 226 includes a Random Access Memory (RAM) 204, a Read-only Memory (ROM) 222, and other storage means. Mass memory 226 illustrates an example of computer readable storage media (devices) for storage of information such as computer readable instructions, data structures, program modules or other data. Mass memory 226 stores a basic input/output system (BIOS) 224, or the like, for controlling low-level operation of client computer 200. The mass memory also stores an operating system 206 for controlling the operation of client computer 200. It will be appreciated that this component may include a general-purpose operating system such as a version of UNIX, or LINUX™, or a specialized client communication operating system such as Microsoft Corporation's Windows Mobile™, Apple Corporation's iOS™, Google Corporation's Android™, or the like. The operating system may include, or interface with a Java virtual machine module that enables control of hardware components and/or operating system operations via Java application programs.

Mass memory 226 further includes one or more data storage 208, which can be utilized by client computer 200 to store, among other things, applications 214 and/or other data. For example, data storage 208 may also be employed to store information that describes various capabilities of client computer 200. The information may then be provided to another computer based on any of a variety of events, including being sent as part of a header during a communication, sent upon request, or the like. Data storage 208 may also be employed to store social networking information including address books, buddy lists, aliases, user profile information, or the like. Further, data storage 208 may also store messages, web page content, or any of a variety of user generated content.

At least a portion of the information stored in data storage 208 may also be stored on another component of client computer 200, including, but not limited to processor readable storage media 230, a disk drive or other computer readable storage devices (not shown) within client computer 200.

Processor readable storage media 230 may include volatile, non-transitive, non-transitory, nonvolatile, removable, and non-removable media implemented in any method or technology for storage of information, such as computer- or processor-readable instructions, data structures, program modules, or other data. Examples of computer readable storage media include RAM, ROM, Electrically Erasable Programmable Read-only Memory (EEPROM), flash memory or other memory technology, Compact Disc Read-only Memory (CD-ROM), digital versatile disks (DVD) or other optical storage, magnetic cassettes, magnetic tape, magnetic disk storage or other magnetic storage devices, or any other physical medium which can be used to store the desired information and which can be accessed by a computer. Processor readable storage media 230 may also be referred to herein as computer readable storage media and/or computer readable storage device.

Applications 214 may include computer executable instructions which, when executed by client computer 200, transmit, receive, and/or otherwise process network data. Network data may include, but is not limited to, messages (e.g. SMS, Multimedia Message Service (MMS), instant message (IM), email, and/or other messages), audio, video, and enable telecommunication with another user of another client computer. Applications 214 may include, for example, a browser 218, and other applications 220.

Browser 218 may include virtually any application configured to receive and display graphics, text, multimedia, messages, and the like, employing virtually any web based language. In one embodiment, the browser application is enabled to employ HDML, WML, WMLScript, JavaScript, SGML, HTML, XML, and the like, to display and send a message. However, any of a variety of other web-based programming languages may be employed. In one embodiment, browser 218 may enable a user of client computer 200 to communicate with another network computer, such as delivery management server computer 116 shown in FIG. 1.

Other applications 220 may include, but are not limited to, calendars, search programs, email clients, IM applications, SMS applications, voice over Internet Protocol (VOIP) applications, contact managers, task managers, transcoders, database programs, word processing programs, software development tools, security applications, spreadsheet programs, games, search programs, and so forth.

Illustrative Network Computer

Figure 3:
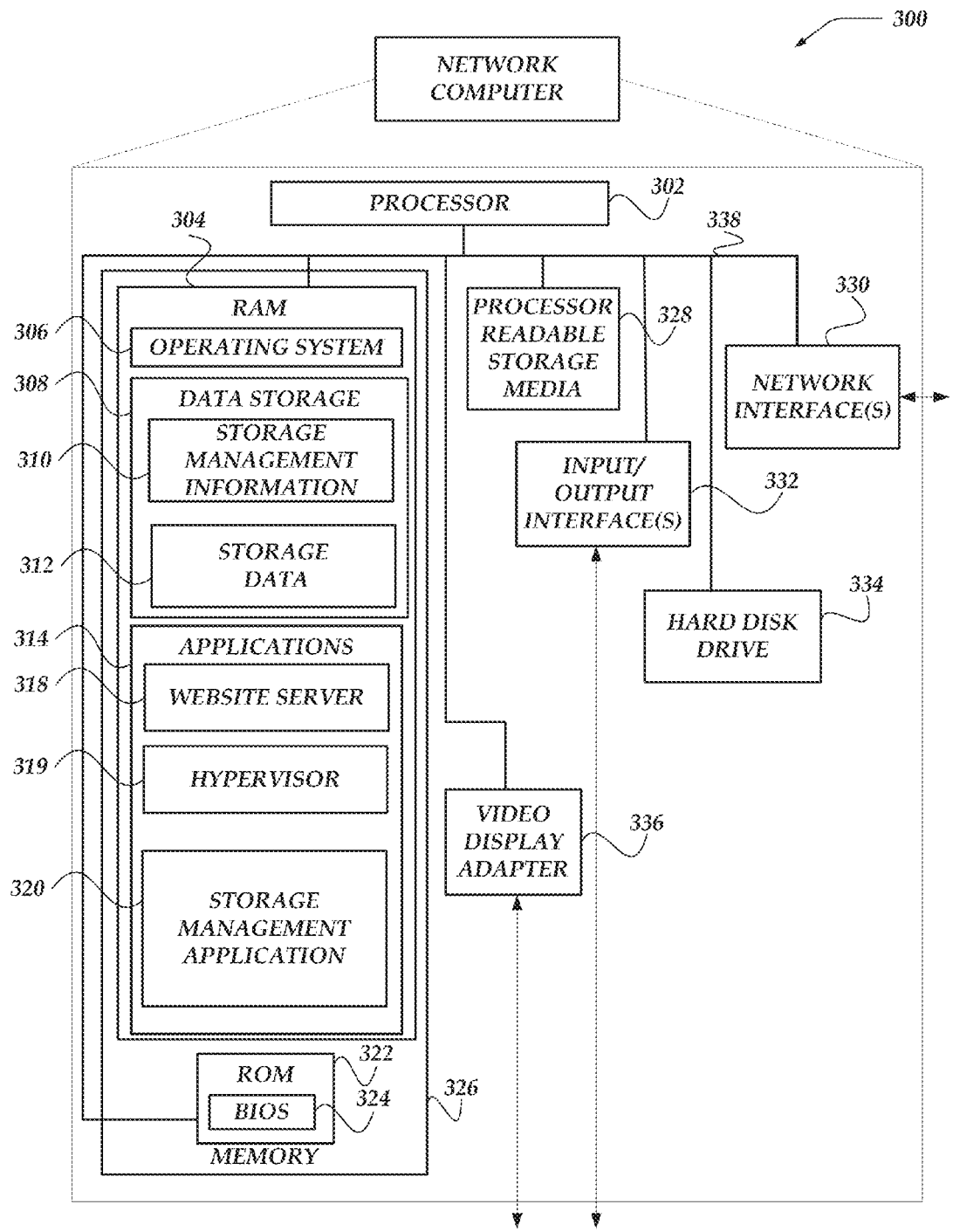
FIG. 3 illustrates a logical schematic embodiment of a network computer.

FIG. 3 shows one embodiment of a network computer 300, according to one embodiment of the invention. Network computer 300 may include many more or less components than those shown. The components shown, however, are sufficient to disclose an illustrative embodiment for practicing the invention. Network computer 300 may be configured to operate as a server, client, peer, a host, cloud instance, or any other computer. Network computer 300 may represent, for example storage management server computer 116, and/or other network computers, such as, computers comprising, storage computer 118, or storage computer 122.

Network computer 300 includes processor 302, processor readable storage media 328, network interface unit 330, an input/output interface 332, hard disk drive 334, video display adapter 336, and memory 326, all in communication with each other via bus 338. In some embodiments, processor 302 may include one or more central processing units.

As illustrated in FIG. 3, network computer 300 also can communicate with the Internet, or other communication networks, via network interface unit 330, which is constructed for use with various communication protocols including the TCP/IP protocol. Network interface unit 330 is sometimes known as a transceiver, transceiving device, or network interface card (NIC).

Network computer 300 also comprises input/output interface 332 for communicating with external devices, such as a keyboard, or other input or output devices not shown in FIG. 3. Input/output interface 332 can utilize one or more communication technologies, such as USB, infrared, NFC, Bluetooth™, or the like.

Memory 326 generally includes RAM 304, ROM 322 and one or more permanent mass storage devices, such as hard disk drive 334, tape drive, optical drive, and/or floppy disk drive. Memory 326 stores operating system 306 for controlling the operation of network computer 300. Any general-purpose operating system may be employed. Basic input/output system (BIOS) 324 is also provided for controlling the low-level operation of network computer 300.

Although illustrated separately, memory 326 may include processor readable storage media 328. Processor readable storage media 328 may be referred to and/or include computer readable media, computer readable storage media, and/or processor readable storage device. Processor readable storage media 328 may include volatile, nonvolatile, non-transitory, non-transitive, removable, and non-removable media implemented in any method or technology for storage of information, such as computer readable instructions, data structures, program modules, or other data. Examples of processor readable storage media include RAM, ROM, EEPROM, flash memory or other memory technology, CD-ROM, digital versatile disks (DVD) or other optical storage, magnetic cassettes, magnetic tape, magnetic disk storage or other magnetic storage devices, or any other media which can be used to store the desired information and which can be accessed by a computer.

Memory 326 further includes one or more data storage 308, which can be utilized by network computer 300 to store, among other things, applications 314 and/or other data. For example, data storage 308 may also be employed to store information that describes various capabilities of network computer 300. The information may then be provided to another computer based on any of a variety of events, including being sent as part of a header during a communication, sent upon request, or the like. Data storage 308 may also be employed to store messages, web page content, or the like. At least a portion of the information may also be stored on another component of network computer 300, including, but not limited to processor readable storage media 328, hard disk drive 334, or other computer readable storage medias (not shown) within network computer 300.

Data storage 308 may include a database, text, spreadsheet, folder, file, or the like, that may be configured to maintain and store user account identifiers, user profiles, email addresses, IM addresses, and/or other network addresses; or the like. Data storage 308 may further include program code, data, algorithms, and the like, for use by a processor, such as processor 302 to execute and perform actions. In one embodiment, at least some of data store 308 might also be stored on another component of network computer 300, including, but not limited to processor-readable storage media 328, hard disk drive 334, or the like.

Data storage 308 may include storage management information 310. In at least one of the various embodiments, storage management information 310 may include information, such as, storage computer/device status, repair task lists, capacity information, user profiles, or the like. Also, in at least one of the various embodiments, data storage 308 may include storage data 312 representing actual data that may be storage on a storage device and/or a storage computer.

Applications 314 may include computer executable instructions, which may be loaded into mass memory and run on operating system 306. Examples of application programs may include transcoders, schedulers, calendars, database programs, word processing programs, Hypertext Transfer Protocol (HTTP) programs, customizable user interface programs, IPSec applications, encryption programs, security programs, SMS message servers, IM message servers, email servers, account managers, and so forth. Applications 314 may also include website server 318, hypervisor 319, or storage management application 320.

Website server 318 may represent any of a variety of information and services that are configured to provide content, including messages, over a network to another computer. Thus, website server 318 can include, for example, a web server, a File Transfer Protocol (FTP) server, a database server, a content server, email server, or the like. Website server 318 may provide the content including messages over the network using any of a variety of formats including, but not limited to WAP, HDML, WML, SGML, HTML, XML, Compact HTML (cHTML), Extensible HTML (xHTML), or the like.

Illustrative Logical Architecture

In at least one of the various embodiments, prioritized repair of storage failures may be operative in a data storage system. In at least one of the various embodiments, storage devices, may be organized into different arrangements not limited to those described below depending on the specific storage requirements of the applications and/or services that may be using the storage systems.

FIG. 4 shows system 400 that is a portion of a data storage system for prioritized repair of storage failures in accordance with at least one of the various embodiments. In at least one of the various embodiments, system 400 may be comprised of a storage management server computer, such as, storage management server computer 402, as well as, one or more storage computers, such as, storage computer 404, storage computer 406, storage computer 408, or the like. In at least one of the various embodiments, each computer may be interconnected over a network, such as, network 410. In at least one of the various embodiments, network 410 may be arranged to be similar to wireless network 108 and/or network 110.

In at least one of the various embodiments, the storage computers may be arranged to include one or more storage devices, such as, storage devices 412, storage devices 414, or storage devices 416. In various embodiments, storage computers may include more or fewer storage devices than illustrated in FIG. 4. In at least one of the various embodiments, storage computers may include a single storage device. And, in some embodiments, one or more storage computers may be arranged to be included in an enclosure or chassis which in turn may be interconnected to other computer and/or storage computers over network 410.

In at least one of the various embodiments, the interconnections between the storage devices and the storage computers may be arranged to have a bandwidth that may be different from the bandwidth of the network connecting the storage computer to network 410. Also, in at least one of the various embodiments, among the different storage computers in system 400, some may be arranged to have different performance characteristics. Such differences may lie in the effective internal bandwidth of the storage computer, the external bandwidth, CPU capacity of the storage computers, storage capacity, reliability (e.g., mean-time-to-failure), protection level, or the like.

In at least one of the various embodiments, storage management server computer 402 may be arranged to include a database/inventory of the capabilities and/or performance characteristics of the storage computers, such as, storage computer 404, storage computer 406, storage computer 408, or the like. Further, in at least one of the various embodiments, a database on storage management server computer 402 may be arranged to include performance and/or characteristics information for each storage device. Also, the inventory of characteristics may include information regarding the network bandwidth and/or throughput capabilities of the different interconnections and/or components of system 400. Further, in at least one of the various embodiments, storage management server computer 402 may be arranged to monitor the performance the storage computers and initiate repairs if errors and/or data failures may be detected and/or reported.

In at least one of the various embodiments, storage management server computer 402 may be arranged to compute and/or monitor the mean-time-to-data-loss (MTTDL) for the storage devices and/or storage computers. In at least one of the various embodiments, this may entail monitoring the current protection level for each portion of the data storage system. Also, in at least one of the various embodiments, storage management server computer 402 may be arranged to monitor and track the current status of each repair task and/or active repair task.

In at least one of the various embodiments, the functionality of storage management server computer 402 may be incorporated directly into one or more storage computers, such as, storage computer 404, storage computer 406, storage computer 408, or the like. In such embodiments a storage management application, such as, storage management application 320 may be operative on one or more of the storage computers. Further, in at least one of the various embodiments, functionality of the storage management server computer may be implemented directly on each storage device. Accordingly, in at least one of the various embodiments, each storage device may be considered a storage computer. Or, alternatively, they may be considered a storage computer that includes a single storage device.

FIGS. 5A-5C illustrate portions of logical architecture of for data storage in accordance with at least one of the various embodiments. One of ordinary skill in the art will appreciate that there are various well-known ways to arrange data storage with erasure coding. Generally, erasure coding requires repair symbol information to be computed and stored in addition to the "real" information that is being stored. The repair symbol information may be used to restore data that may be lost or corrupted. In some embodiments, amount the repair symbol information stored for each storage unit (e.g., data block) corresponds to the number of simultaneous failures that may be recovered from. FIGS. 5A-5C illustrate different ways data and repair symbol information may be arranged in a data storage system. In at least one of the various embodiments, a particular set of data storage units with corresponding repair symbol storage unit may be considered to be a data stripe.

The examples illustrated with these figures are representative of a few of the different types of well-known storage arrangements where the innovations herein may be applicable. One of ordinary skill in the art will appreciate that the examples below represent a generalized discussion a few of the strategies for using erasure coding with data storage. Actual data storage embodiments may include many more or fewer components than are described herein, but these figures and their accompanying descriptions are at least sufficient to enable one of ordinary skill in the art to practice the claimed innovations.

Further, in at least one of the various embodiments, these illustrative embodiments are presented to provide context and clarification of the claimed innovations. However, the innovations are not so limited and may be employed with any data storage system that includes storage failure recovery facilities.

FIG. 5A illustrates a data storage architecture for system 500 that includes data storage units 502 that may be comprised of multiple storage units, such as, hard drives. Also, in at least this example, there are two levels of protection provided by repair symbol units 504.

In at least one of the various embodiments, one or more well-known data striping and/or erasure coding methods may be employed to distribute data across the storage units with their corresponding repair symbol information stored in repair symbol units 504. In this example, system 500 is illustrated as having two repair symbol units which enable system 500 to recover from two simultaneous failures. Likewise, if three or more simultaneous failures occur, data may be lost because of failures may be unrecoverable using erasure coding (decoding). Note, there may be other recovery methods such as restoring from another replication store or backup of the data, but these will operate separate from the erasure coding that may be used in system 500.

In at least one of the various embodiments, system 500 may be referred to as having two levels of protection, because it has two repair symbol units enabling it to withstand two simultaneous failures. In at least one of the various embodiments, storage systems may be arranged to have more or fewer repair symbol units providing more or less protection. For example, if a storage system includes three repair symbol units it may be described as having three levels of protection because it may be able to recover from three simultaneous failures before irrevocably losing data. One or more well-known erasure coding algorithms may be employed for generating repair symbol information and recovery from data failure, such as, Reed-Solomon coding, XORing, Hamming codes, or the like.

In at least one of the various embodiments, in system 500, as data is stored it may be striped such that a portion of the data may be stored on each of storage devices 502 and computed repair symbol information for the data may be stored on each of repair symbol devices 504. In this example, such an arrangement may be referred to as 10+2 storage, indicating ten storage devices with two repair symbol devices—resulting in a protection level of two.

In at least one of the various embodiments, system 500 may be arranged to include one or more data stripes, it is illustrated herein as a single stripe for brevity and clarity. However, one of ordinary skill in the art will appreciate that embodiments having more data stripes are envisaged and that they are within the scope of the claimed innovations.

FIG. 5B illustrates a data storage architecture for system 506 that is arranged differently than system 500 described in FIG. 5A. In at least one of the various embodiments, system 506 may be arranged to support local repair and/or local repair symbol information. Accordingly, in at least one of the various embodiments, the storage units may be arranged into storage groups, such as storage group 508 and storage group 510. With global protection provided by repair symbol information stored in repair symbol units 512. Also, in at least one of the various embodiments, repair symbol information for a given storage group may be stored in storage units that may be stored local to the storage group. For example, in system 506, storage group 508 includes local repair symbol unit 514 and storage group 510 includes local repair symbol unit 516.

In at least one of the various embodiments, local repair symbol information may be used to recover from one or more failures that occur in the local group. Typically, local repair symbol information may be arranged to enable recovery from one error that may occur in its corresponding local storage group. But, in some embodiments, local repair symbol information may be arranged to enable recovery from more than one error in its corresponding local storage group.

Accordingly, in at least one of the various embodiments, if the number of simultaneous failures covered by the local repair symbol unit is exceeded, the system may fallback to rely on the global repair symbol units, such repair symbol units 512.

In at least one of the various embodiments, local repair symbol units may enable data recovery from a local storage group failure to resolve faster. For example, if a storage unit in storage group 508 experiences a failure, the recovery process may require four data reads, one read from each of the three surviving storage units in the group and one read from the local repair symbol unit to recover the data. For comparison, if one failure occurs in system 500 at least ten read operations will be required to recover the lost data—one read from each surviving storage unit, and one read from the repair symbol units. However, in system 506, if the number of failures exceed the protection level of the local repair symbol units, recovery may require reads from all surviving storage units and each global repair symbol unit.

In at least one of the various embodiments, system 506 may be arranged to include one or more data stripes, it is illustrated herein as a single stripe for brevity and clarity. However, one of ordinary skill in the art will appreciate that embodiments having one or more data stripes are envisaged and that they are within the scope of the claimed innovations.

FIG. 5C illustrates a data storage architecture for system 518 that is arranged differently than system 500 and system 506. In at least one of the various embodiments, system 518 represents a data storage system arranged to de-cluster storage blocks for a given data stripe. In at least one of the various embodiments, de-clustering implies that data stripes may be spread out among multiple storage device to mitigate the impact any given failure.

In this example, for some embodiments, storage devices, such as, storage devices 520-528 may be arranged to three partitions for holding multiple data stripes. Accordingly, since the storage devices, in this example, are arrayed five wide, with 2+1 stripes (data stripes having two storage blocks and one repair symbol block) that may be arranged to advantageously locate the storage blocks and repair symbol blocks for each data stripe to mitigate the impact of failure and/or recovery of a storage device.

In at least one of the various embodiments, block 532 represents a first storage block of Stripe A (A-1) located on storage device 520. Likewise, in this example, the second storage block for Stripe A, A-2, may be located on the storage device 526, while the repair symbol block, for stripe A, A-RS may be located on storage device 528. Likewise, in this example, data corresponding to Stripe C's first storage block may be located at block 534 (C-1), the second storage block (C-2) may be located at block 536, and its repair symbol block (C-P) may be located at block 538. In at least one of the various embodiments, de-clustering may mitigate the impact of some data failures and/or subsequent recovery.

For example, in system 518, if storage device 526 fails, all three data blocks that it includes may be removed from service. In this example, the failure impacts Stripe A and Stripe B because the second storage block for Stripe A and the repair symbol block for Stripe B are collocated on storage device 526. During recovery the lost data, storage block B-1 located on storage device 522, and storage block B-2 located on storage device 528 are read to recover the repair symbol information for repair symbol block B-RS that was lost as result of the failure of storage device 526. In this example, the failure of storage device 526 does not impact Stripe C since all of its blocks remain intact.

Further, in some de-clustered storage arrangements, the storage blocks may be spread out such that, in some cases, recovery operations may not have any impact on some stripes. For example, if Stripe C did not share a storage device with either Stripe A or Stripe B, then Stripe C would be even less impacted by the failure of storage device 526.

In at least one of the various embodiments, system 518 may be arranged to include more or fewer data stripes, as illustrated herein. Accordingly, one of ordinary skill in the art will appreciate that embodiments having more or fewer data stripes are envisaged and that they are within the scope of the claimed innovations.

Generalized Operation

Figure 6:
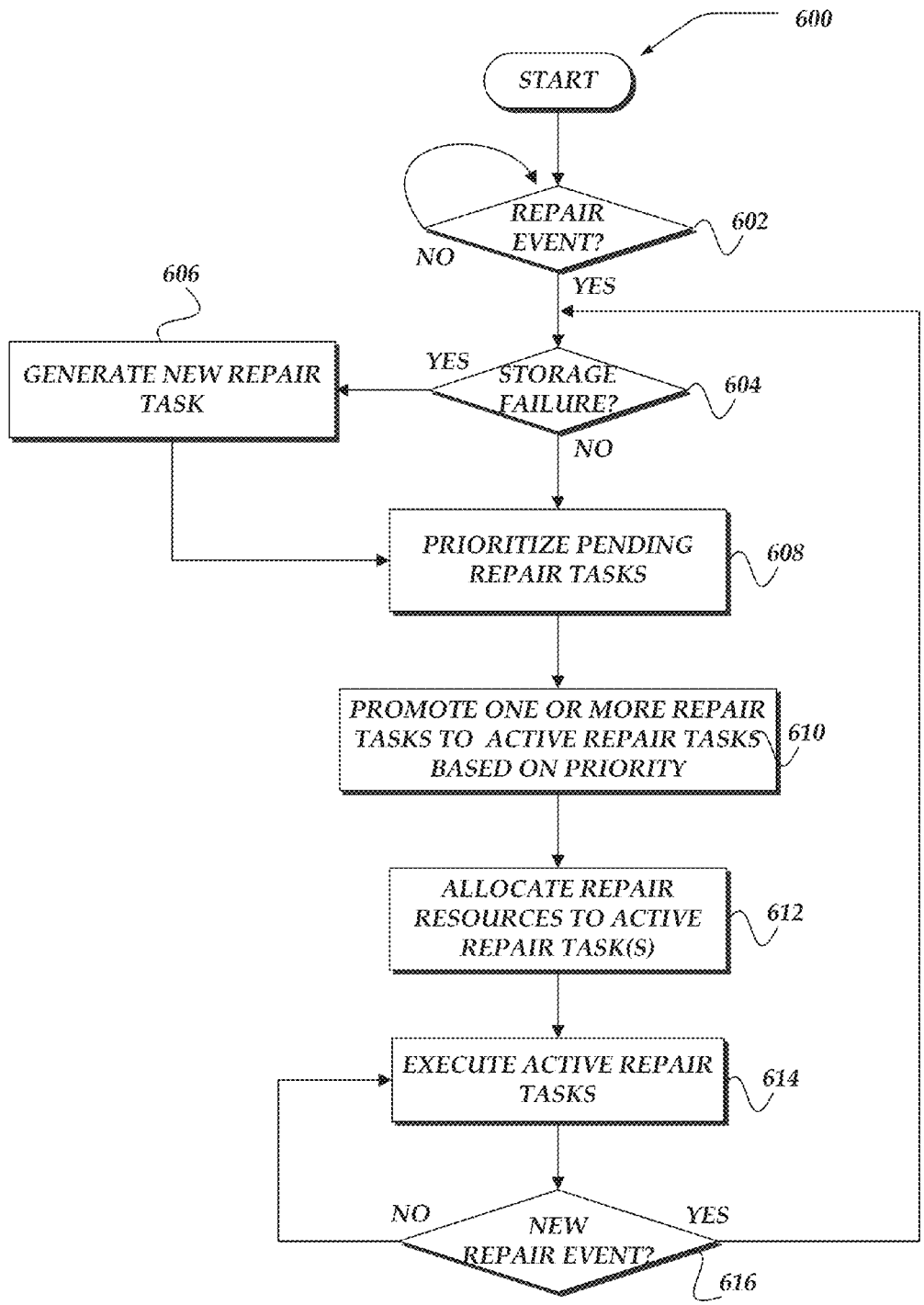
FIG. 6 shows an overview flowchart for a process for prioritized repair of storage failures in accordance with at least one of the various embodiments.
Figure 7:
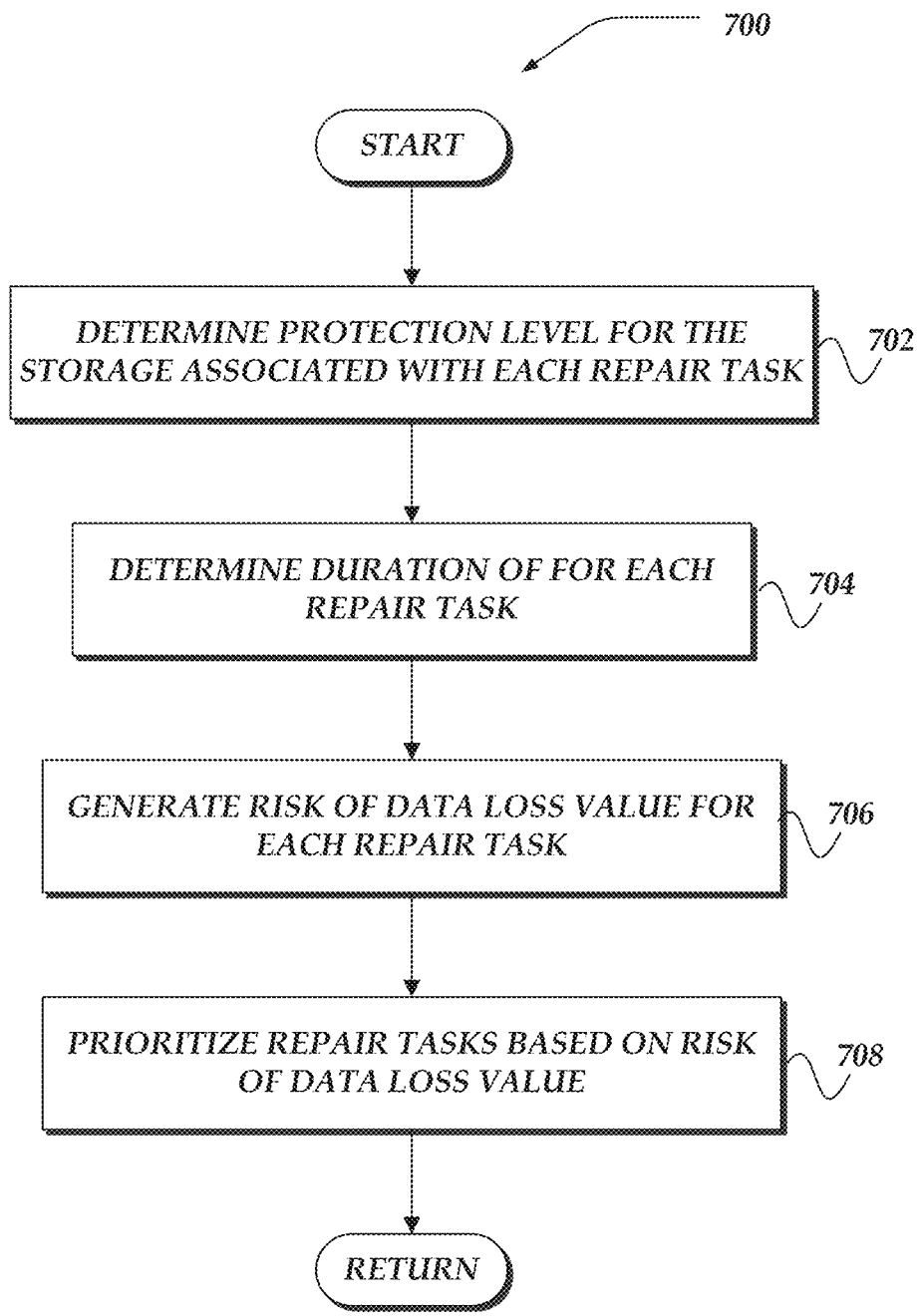
FIG. 7 shows an overview flowchart for a process for prioritizing repair tasks in accordance with at least one of the various embodiments.
Figure 8:
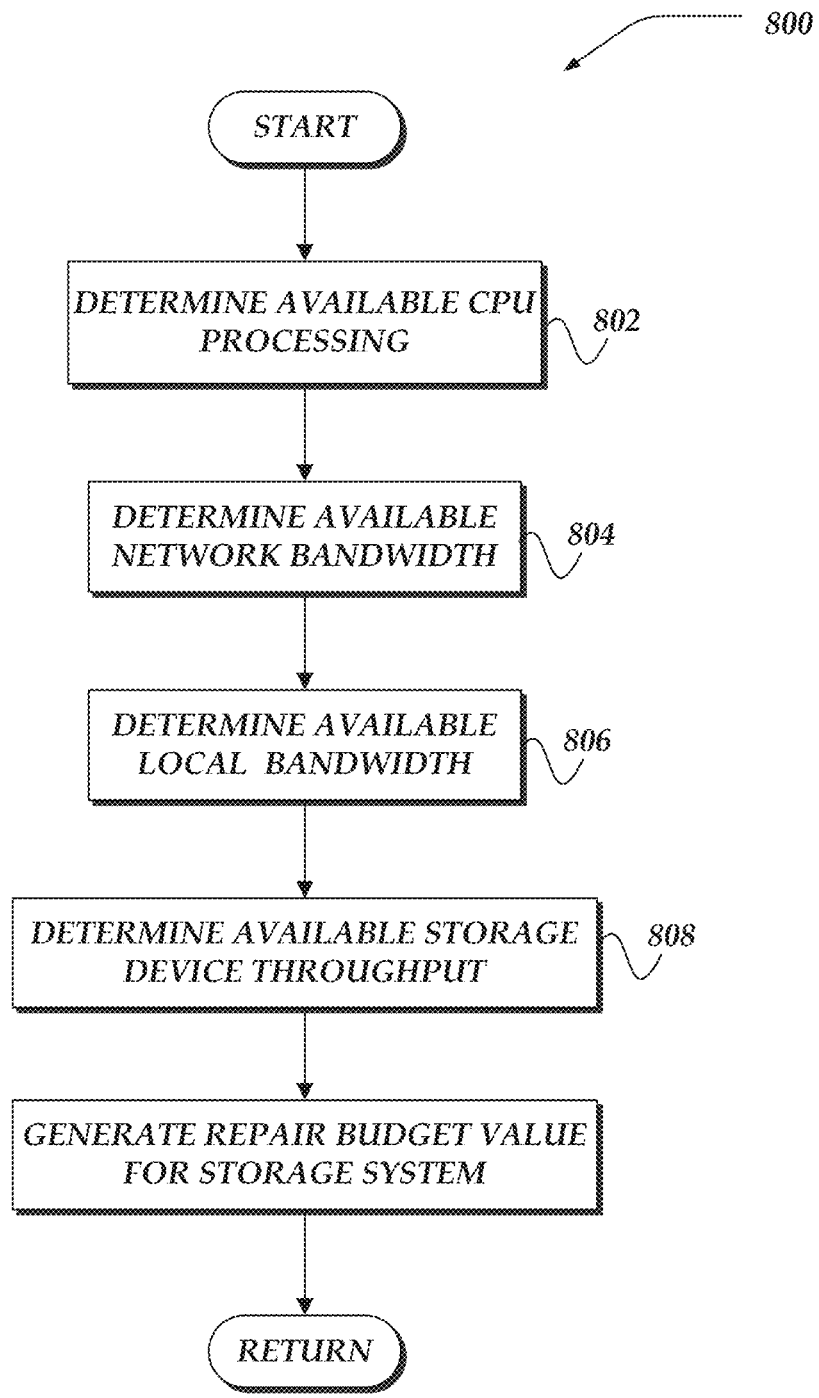
FIG. 8 shows an overview flowchart for a process for determining resource budgets in accordance with at least one of the various embodiments.

FIGS. 6-8 represent the generalized operation for prioritized repair of data storage repairs in accordance with at least one of the various embodiments. In at least one of the various embodiments, processes 600, 700, and 800 described in conjunction with FIGS. 6-8 may be implemented by and/or executed on a single network computer, such as network computer 300 of FIG. 3. In other embodiments, these processes or portions of process thereof may be implemented by and/or executed on a plurality of network computer, such as network computer 300 of FIG. 3. In yet other embodiments, these processes or portions thereof may be implemented by and/or executed on one or more virtualized computer, such as, those in a cloud-based environment. However, embodiments are not so limited and various combinations of network computers, client computers, or the like may be utilized. Further, in at least one of the various embodiments, the processes described in conjunction with FIGS. 6-8 may be operative in storage systems and/or architectures such as those described in conjunction with FIGS. 4 and 5.

FIG. 6 shows an overview flowchart for process 600 for prioritized repair of storage failures of an application with at least one of the various embodiments. After a start block, at decision block 602, in at least one of the various embodiments, if a repair event may be provided and/or detected, control may flow to decision block 604; otherwise, control may remain at decision block 602.

In at least one of the various embodiments, a storage management application, such as, storage management application 320 may be arranged to receive one or more communications associated with the operational status of one or more storage computers. In some cases, these communications may be repair events that may include information, such as, storage failures, repair tasks, completion of active repair tasks, or the like.

In at least one of the various embodiments, the repair events may include information that may enable a storage management application to classifying the event and determine which storage computer and/or storage device may be associated with the event. Repair events may be at least classified as storage failure events or task completion events.

In at least one of the various embodiments, repair events may be classified as resource status updates. Resource status updates may occur if one or more repair resources become available for reasons other than an active repair task having completed. For example, in at least one of the various embodiments, if a higher priority file read that consumes significant network bandwidth finishes, the associated repair event may enable the storage management application to allocate the newly available bandwidth resource to a repair task. Also, in at least one of the various embodiments, a repair event may be related to another storage task (non-repair related) coming online and consuming resources that were available to repair tasks.

At decision block 604, in at least one of the various embodiments, if the repair event corresponds to a storage failure, control may flow to block 606; otherwise, control may flow to block 608. In at least one of the various embodiments, the storage management application may be arranged to include one or more filters that may be employed to classify the incoming repair events. In at least one of the various embodiments, the filters may be arranged to use pattern matching to identify one or more characteristics of the event content to classify the incoming repair events.

At block 606, in at least one of the various embodiments, since the repair event corresponds to a storage failure, a new repair task may be generated and registered with one or more task lists. In at least one of the various embodiments, a repair task may be generated because the repair event indicates that one or more storage devices in the storage system has experienced a failure. The details of particular repair task that may be generated may vary depending on the information included in the repair event and/or the characteristics of the failures/failed device. In at least one of the various embodiments, the storage management application may include configuration information that may be employed to determine the characteristics of the repair task.

For example, in at least one of the various embodiments, if the storage system employs erasure coding, the management application may generate a repair task for restoring data associated with the failure. The determination of which storage units and repair symbol units to use may be based on the arrangement and/or configuration of the storage system.

At block 608, in at least one of the various embodiments, pending repair tasks that may be included in one or more repair task lists may be prioritized. In at least one of the various embodiments, each repair task registered with the storage management application may be prioritized based on a priority value that corresponds to each repair task. In at least one of the various embodiments, the priority value associated with each repair task may be a compound value that reflects the risk of data loss associated with the storage failure associated with the repair task. Accordingly, the higher the priority value, the higher the risk of irrevocable data loss. See, FIG. 7 and its accompanying description.

In at least one of the various embodiments, a priority value for each repair task in the task list may be determined based in part on a mean-time-to-data-loss (MTTDL) value associated with each repair task in the task list, wherein a lower MTTDL value generates a higher priority value over a higher MTTDL value.

At block 610, in at least one of the various embodiments, one or more repair tasks may be promoted to active repair tasks based on at least their determined priority value. In at least one of the various embodiments, an active repair task may be a repair task that may designated for execution. In at least one of the various embodiments, repair tasks that may be executing may be considered active repair tasks. Likewise, in at least one of the various embodiments, repair tasks that are not promoted to active repair tasks may be actively performing repair actions.

In at least one of the various embodiments, if a repair task is determined to have a higher priority value than a current active repair task (e.g., a repair task that is actively performing actions), that active repair task may be suspended by demoting it back to being a repair task. Also, any repair resources previously allocated to the demoted active repair task may be released. Accordingly, suspending an active repair task may transform it back into a normal pending repair task. Further, in at least one of the various embodiments, a storage management application may be arranged to store the progress information for the demoted repair task enabling it to continue where it left off if it is promoted to an active repair task in the future.

In at least one of the various embodiments, repair tasks may be promoted to be a new active repair task if the priority value for the promoted repair task is higher than each other repair task and enough of a resource budget may be available to execute the new active repair task when each current active repair task is executing.

Also, in at least one of the various embodiments, a repair task may be promoted to a new active repair task if a priority value for the promoted task is higher than the priority level of at least one current active repair task such that each current active repair task is demoted to a repair task that has a lower priority value than the priority value for the new active repair task until enough of the resource budget is released to execute the new active repair task.

At block 612, in at least one of the various embodiments, repair resources may be allocated to one or more active repair tasks. In at least one of the various embodiments, one or more repair resources necessary to for executing the active repair tasks may be allocated from a resource budget. In at least one of the various embodiments, allocated repair resources may be considered unavailable until the associated active repair task is finished or it is demoted back to a repair task.

In at least one of the various embodiments, the available repair resources may be allocated from a resource budget that may be computed based on performance capabilities. Accordingly, in at least one of the various embodiments, each repair task may be assigned a resource budget cost corresponding to the type of actions comprising the repair task. For example, if a 20+2 data stripe (e.g., 20 storage units and 2 repair symbol units per data stripe) experiences non-local data failure in two data storage blocks, its repair task may require enough network bandwidth to read data from 18 storage blocks and 2 repair symbol blocks to recover from the data failure. Also, in this example, CPU resources for regenerating the lost data will require erasure decoding computation using the data from the 18 storage block and the 2 repair symbol blocks. In this example, the actual costs will depend on the size of the blocks and the type of erasure coding that is used.

In at least one of the various embodiments, if there may be repair resource budget remaining, additional lower priority repair tasks may be promoted to active repair tasks. In some cases, a repair task having a lower priority may be promoted ahead of a higher priority repair task. A number of lower priority repair tasks may be promoted to maximize the consumption of the resource budget.

In at least one of the various embodiments, the availability of unallocated repair resources may enable process 600 to promote a lower priority repair task to an active repair task ahead of other repair tasks having a higher priority. If the lower priority repair task requires unallocated repair resources—no other higher priority repair task has been allocated those resources—it may be allocated those repair tasks and promoted to an active repair task.

For example, repair task A with priority 5 (the highest) may be promoted to an active repair task and allocated sufficient repair resources to execute. If repair task B with a priority of 4 requires one or more resources already allocated to repair task A, it will have to wait. However, if repair task C with a priority of 1 can be executed using repair resources that are not needed for repair task A and repair task B, it may be allocated those repair resources and promoted to an active repair task for execution.

Further, in at least one of the various embodiments, a repair task may be promoted to a new active repair task if a remainder of the resource budget enables execution of the new active repair task if the priority value of the new active repair task is lower than at least one other active repair task requiring other than the remainder to execute.

At block 614, in at least one of the various embodiments, the one or more active repair tasks may be executed. In at least one of the various embodiments, the storage management application may be arranged to execute the active repair tasks directly. For example, in these embodiments, the storage management application may be arranged to perform data restore operations. In other embodiments, the storage management application may direct another application or service to perform the actions that may comprise the active repair task.

At decision block 616, in at least one of the various embodiments, if a new repair event is provided to process 600, control may loop back to decision block 604; otherwise control may loop back to block 614. In at least one of the various embodiments, the arrival of a new repair event, whether it is an active repair task completed event or a new storage failure event, may trigger a re-prioritization of the repair tasks and active repair tasks. In at least one of the various embodiments, active repair tasks may be preemptively suspended and demoted back to repair tasks based on the result of the reprioritization. Likewise, in at least one of the various embodiments, repair resources may be re-allocated each time new repair event is provided. Next, in at least one of the various embodiments, control may be returned to a calling process.

FIG. 7 shows an overview flowchart for process 700 for prioritizing repair tasks in accordance with at least one of the various embodiments. After a start block, at block 702, in at least one of the various embodiments, a value representing the protection level of the data associated with each repair task may be determined. As discussed above, the protection level for data storage represents how many data failures may be experienced before data is lost.

Accordingly, in at least one of the various embodiments, the storage management application may be arranged to maintain a record of the current protection level for a given portion of data storage and track the number of outstanding failures that have not been repaired. Thus, in at least one of the various embodiments, as data failures occur for a given portion of data storage the risk that data loss may occurs (in the event of a subsequent failure) increases.

At block 704, in at least one of the various embodiments, a duration value corresponding to the amount of time it may take to complete each repair task may be determined. In at least one of the various embodiments, the storage management application may be arranged to estimate how long the actions associated with a repair will take to complete. In some embodiments, the storage management application may be arranged to compute an expected duration of the repair based on one or more factors, such as, the characteristics of the data storage system, the characteristics of the failure, the type of erasure coding, or the like. For example, in at least one of the various embodiments, if a data failure occurs in a data stripe that spans 20 storage devices, the storage management application may compute an estimate of the duration for repair based on the amount of data that must be read to restore the failure, the available network bandwidth between the storage management server computer and the storage computers, the available bandwidth of the storage devices within each storage computer, the decoding performance of erasure coding algorithm, or the like.

Further, in at least one of the various embodiments, the storage management application may be arranged to determine repair durations based on configuration information that may be provided by a user, retrieved from a file or database, or the like. Accordingly, in at least one of the various embodiments, each repair task may be assigned a duration and/or time for completion.

At block 706, in at least one of the various embodiments, a risk of loss value corresponding to each repair task may be generated. In at least one of the various embodiments, it may incorporate the information determined in block 702 and block 704 as well as other considerations. In at least one of the various embodiments, the risk of loss associated with a repair task is related to the likelihood that data may be irrevocably lost. In at least one of the various embodiments, the storage management application may be arranged to generate a risk of loss value for each repair task based on at least how long it may take to complete the repair, and the remaining protection level of data associated with a repair task.

Also, in at least one of the various embodiments, the risk of loss value may include known risk factors associated with the storage devices, such as, mean-time-to-failure, age, storage device usage pattern, or the like.

At block 708, in at least one of the various embodiments, the repair tasks may be prioritized based on the risk of loss corresponding to each repair task. In at least one of the various embodiments, a storage management application may be arranged to compute a priority value for each repair task. The higher the priority is for a given repair task, the closer the underlying data is to risking an unrecoverable failure because the protection level afforded by the repair symbol information is exceeded.

In some embodiments, the storage management application may be arranged to enable one or more storage computers and/or storage devices to be configured and/or assigned to have more or less priority than others. In at least one of the various embodiments, priority values may be further modified based on one or more rule based policies, user intervention, or the like. Next, in at least one of the various embodiments, control may be returned to a calling process.

FIG. 8 shows an overview flowchart for process 800 for determining resource budgets in accordance with at least one of the various embodiment. In at least one of the various embodiments, the storage management application may be arranged to maintain one or more resource budgets that represent an amount of available repair resources that may be allocated to active repair tasks. Resource budgets may be comprised values representing an amount of CPU processing, network bandwidth, local throughput, storage device throughput, or the like, that may be available for executing active repair tasks.

After a start block, at block 802, in at least one of the various embodiments, process 800 may determine the available processing power for the central processing units that may be available. In at least one of the various embodiments, a storage management application may be arranged to obtain CPU utilization metrics from the storage computers and/or storage management server computers that may be available for executing repair tasks. At block 804, in at least one of the various embodiments, process 800 may be arranged to determine the available network bandwidth between the one or more storage computers, storage management server computers, intervening networks, or the like.

In at least one of the various embodiments, bandwidth capacity for different portions and/or sub-networks may be determined and tracked independently as part of a resource budget. Accordingly, the topology of a network in relationship to a particular storage failure may impact allocation of repair resources and/or the execution of active repair tasks. For example, referring to FIG. 4, if a storage failure requires a repair task that operates on storage computer 404 and storage computer 406, the network bandwidth between each storage computer and storage management server computer 402 may be different. Accordingly, in this example, the resource budget may include different values corresponding to the different bandwidth for each storage computer.

At block 806, in at least one of the various embodiments, process 800 may be arranged to determine the available local bandwidth for each storage computer. This local bandwidth may represent the internal communication pathways (e.g., internal bus) within a storage computer between and/or among the storage devices that may be onboard the storage computer.

In at least one of the various embodiments, resource budget may include entries representing the local bandwidth for each storage computer and/or in some cases, different portions of the storage computer—if the it different portions have different local bandwidth.

At block 808, in at least one of the various embodiments, process 800 may determine the available throughput for the one or more storage devices onboard storage computers. In at least one of the various embodiments, the available throughput may be based on information provided by the individual storage device manufactures. Accordingly, in at least one of the various embodiments, the storage management application may be arranged to store such information in a database or other configuration store. Also, in at least one of the various embodiments, the storage management application may be arranged to profile performance characteristics of the storage devices by executing one or more storage (read/write) speed tests to obtain performance information that may be employed for determining storage device throughput. Also, in at least one of the various embodiments, the storage management application may be arranged to passively monitor the performance characteristic of the storage devices used in the storage system to developer performance profiles that may be used for determining device throughput.

At block 810, in at least one of the various embodiments, a repair budget for the storage system may be generated. In at least one of the various embodiments, the resource budget may list the resources (CPU, network bandwidth, local bandwidth, storage device throughput, or the like) that may available for allocating to one or more repair tasks.

In at least one of the various embodiments, resource budgets may be updated at various times, such as, when active repair tasks are allocated repair resources, when active repair tasks release repair resources, periodically based on a configuration value, as directed by a user, when the arrangement/topology of the storage system is modified, after storage failures, or the like.

In at least one of the various embodiments, the storage management application may be arranged to enable a user to modify and/or adjust one or more values in the resource budget and available for repair tasks and/or active repair tasks. In at least one of the various embodiments, a user may modify the network bandwidth that is made available for repair tasks. For example, a user may limit the amount network bandwidth made available for repair resources to 50% of utilization to guarantee sufficient bandwidth for other users of the network.

Likewise, in at least one of the various embodiments, a user may assign limits to the other parts of the resource budget. Also, in at least one of the various embodiments, a user may be enabled to associate resource budget limits with repair task priority values. For example, low priority repair tasks may be limited to less repair resources than higher priority repair tasks. Also, in at least one of the various embodiments, a storage management application, may be arranged to enable resource budgets to be configured based on other characteristics of the storage system. For example, resource budget limits may be associated with one or more particular storage computer and/or storage device. Next, in at least one of the various embodiments, control may be returned to a calling process.

It will be understood that figures, and combinations of actions in the flowchart-like illustrations, can be implemented by computer program instructions. These program instructions may be provided to a processor to produce a machine, such that the instructions executing on the processor create a means for implementing the actions specified in the flowchart blocks. The computer program instructions may be executed by a processor to cause a series of operational actions to be performed by the processor to produce a computer implemented process for implementing the actions specified in the flowchart block or blocks. These program instructions may be stored on some type of machine readable storage media, such as processor readable non-transitory storage media, or the like.

Accordingly, the illustrations support combinations of means for performing the specified actions, combinations of steps for performing the specified actions and program instruction means for performing the specified actions. It will also be understood that each block of the flowchart illustration, and combinations of blocks in the flowchart illustration, can be implemented by modules such as special purpose hardware systems which perform the specified actions or steps, or combinations of special purpose hardware and computer instructions.

What is claimed as new and desired to be protected by Letters Patent of the United States is:

1. A method for managing data storage over a network using a network computer that executes instructions that perform actions, comprising:
   when one or more repair events are associated with one or more new storage failures on a storage unit or a repair symbol unit, generating one or more new repair tasks that are associated with the one or more new storage failures;
   determining a resource budget based on a network bandwidth capacity for one or more different portions of the network, wherein the resource budget includes separate values for each of the different portions of the network;
   determining a protection level that represents a maximum number of storage unit or repair symbol unit failures before particular data is irrevocably lost on the data storage;
   determining a risk of irrevocable loss for each repair task;
   promoting the one or more repair tasks to be one or more new active repair tasks when a priority value for the one or more repair tasks is higher than a priority value for one or more active repair tasks and enough of the resource budget is available to execute the one or more new active repair tasks when each active repair task is executing; and
   executing each active repair task to repair the one or more storage failures that are associated with the one or more active repair tasks.

2. The method of claim 1, further comprising determining each priority value for each repair task in a task list for at least one current storage failure based in part on a comparison of one or more characteristic values that are associated with each repair task in the task list, wherein a lower characteristic value generates a higher priority value over a higher characteristic value.

3. The method of claim 1, further comprising promoting the one or more repair tasks to be one or more promoted new active repair tasks when each priority value for the one or more promoted new active repair tasks is higher than each priority value for the one or more active repair tasks, wherein the one or more active repair tasks are demoted to a repair task that has a lower priority value than the priority value for the one or more promoted new active repair tasks until enough of the resource budget is released to execute the one or more promoted new active repair tasks.

4. The method of claim 1, further comprising promoting the one or more repair tasks to be one or more promoted new active repair tasks when a remainder of the resource budget enables execution of the one or more repair tasks when the priority value of the one or more repair tasks is lower than the priority value of the one or more active repair tasks requiring other than the remainder to execute.

5. The method of claim 1, wherein determining the priority value for each repair task further comprises:
   determining a duration for each repair task;
   determining the priority value based on the duration for each repair task; and
   prioritizing repair tasks based on either longer durations being prioritized over repair tasks with shorter durations or shorter durations being prioritized over repair tasks with longer durations.

6. The method of claim 1, wherein the resource budget is dynamically updated based on one or more of, compute processing, network bandwidth, local bandwidth, non-repair related storage task, higher priority file read, storage device throughput, type of erasure encoding, or type of actions to perform each repair task.

7. The method of claim 1, wherein executing the at least one active repair task, further comprises, employing one or more of a storage management application, a service or another application to repair at least one portion of a data stripe associated with the at least one storage failure based on erasure coding.

8. A system that is arranged for managing data storage over a network, comprising:
   a network computer comprising:
      a transceiver that is operative to communicate over the network;
      a memory that is operative to store at least instructions; and
      a processor device that is operative to execute instructions that enable actions, including:
         when one or more repair events are associated with one or more new storage failures on a storage unit or a repair symbol unit, generating one or more new repair tasks that are associated with the one or more new storage failures;
         determining a resource budget based on a network bandwidth capacity for one or more different portions of the network, wherein the resource budget includes separate values for each of the different portions of the network;
         determining a protection level that represents a maximum number of storage unit or repair symbol unit failures before particular data is irrevocably lost on the data storage;
         determining a risk of irrevocable loss for each repair task;
         promoting the one or more repair tasks to be one or more new active repair tasks when a priority value for the one or more repair tasks is higher than a priority value for one or more active repair tasks and enough of the resource budget is available to execute the one or more new active repair tasks when each active repair task is executing; and
         executing each active repair task to repair the one or more storage failures that are associated with the one or more active repair tasks; and
   a client computer, comprising:
      a transceiver that is operative to communicate over the network;
      a memory that is operative to store at least instructions; and
      a processor device that is operative to execute instructions that enable actions, including:
         providing configuration information to the network computer.

9. The system of claim 8, further comprising determining each priority value for each repair task in a task list for at least one current storage failure based in part on a comparison of one or more characteristic values that are associated with each repair task in the task list, wherein a lower characteristic value generates a higher priority value over a higher characteristic value.

10. The system of claim 8, further comprising promoting the one or more repair tasks to be one or more promoted new active repair tasks when each priority value for the one or more promoted new active repair tasks is higher than each priority value for the one or more active repair tasks, wherein the one or more active repair tasks are demoted to a repair task that has a lower priority value than the priority value for the one or more promoted new active repair tasks until enough of the resource budget is released to execute the one or more promoted new active repair tasks.

11. The system of claim 8, further comprising promoting the one or more repair tasks to be one or more promoted new active repair tasks when a remainder of the resource budget enables execution of the one or more repair tasks when the priority value of the one or more repair tasks is lower than the priority value of the one or more active repair tasks requiring other than the remainder to execute.

12. The system of claim 8, wherein determining the priority value for each repair task further comprises:
   determining a duration for each repair task;
   determining the priority value based on the duration for each repair task; and
   prioritizing repair tasks based on either longer durations being prioritized over repair tasks with shorter durations or shorter durations being prioritized over repair tasks with longer durations.

13. The system of claim 8, wherein the resource budget is dynamically updated based on one or more of, compute processing, network bandwidth, local bandwidth, non-repair related storage task, higher priority file read, storage device throughput, type of erasure encoding, or type of actions to perform each repair task.

14. The system of claim 8, wherein executing the at least one active repair task, further comprises, employing one or more of a storage management application, a service or another application to repair at least one portion of a data stripe associated with the at least one storage failure based on erasure coding.

15. A processor readable non-transitory storage media that includes instructions for managing data storage over a network, wherein execution of the instructions by a processor device enables actions, comprising:
   when one or more repair events are associated with one or more new storage failures on a storage unit or a repair symbol unit, generating one or more new repair tasks that are associated with the one or more new storage failures;
   determining a resource budget based on a network bandwidth capacity for one or more different portions of the network, wherein the resource budget includes separate values for each of the different portions of the network;
   determining a protection level that represents a maximum number of storage unit or repair symbol unit failures before particular data is irrevocably lost on the data storage;
   determining a risk of irrevocable loss for each repair task;
   promoting the one or more repair tasks to be one or more new active repair tasks when a priority value for the one or more repair tasks is higher than a priority value for one or more active repair tasks and enough of the resource budget is available to execute the one or more new active repair tasks when each active repair task is executing; and
   executing each active repair task to repair the one or more storage failures that are associated with the one or more active repair tasks.

16. The media of claim 15, further comprising determining each priority value for each repair task in a task list for at least one current storage failure based in part on a comparison of one or more characteristic values that are associated with each repair task in the task list, wherein a lower characteristic value generates a higher priority value over a higher characteristic value.

17. The media of claim 15, further comprising promoting the one or more repair tasks to be one or more promoted new active repair tasks when each priority value for the one or more promoted new active repair tasks is higher than each priority value for the one or more active repair tasks, wherein the one or more active repair tasks are demoted to a repair task that has a lower priority value than the priority value for the one or more promoted new active repair tasks until enough of the resource budget is released to execute the one or more promoted new active repair tasks.

18. The media of claim 15, further comprising promoting the one or more repair tasks to be one or more promoted new active repair tasks when a remainder of the resource budget enables execution of the one or more repair tasks when the priority value of the one or more repair tasks is lower than the priority value of the one or more active repair tasks requiring other than the remainder to execute.

19. The media of claim 15, wherein determining the priority value for each repair task further comprises:
   determining a duration for each repair task;
   determining the priority value based on the duration for each repair task; and
   prioritizing repair tasks based on either longer durations being prioritized over repair tasks with shorter durations or shorter durations being prioritized over repair tasks with longer durations.

20. The media of claim 15, wherein executing the at least one active repair task, further comprises, employing one or more of a storage management application, a service or another application to repair at least one portion of a data stripe associated with the at least one storage failure based on erasure coding.

21. A network computer that is operative for managing data storage over a network, comprising:
   a transceiver that is operative to communicate over a network;
   a memory that is operative to store at least instructions; and
   a processor device that is operative to execute instructions that enable actions, including:
      when one or more repair events are associated with one or more new storage failures on a storage unit or a repair symbol unit, generating one or more new repair tasks that are associated with the one or more new storage failures;
      determining a resource budget based on a network bandwidth capacity for one or more different portions of the network, wherein the resource budget includes separate values for each of the different portions of the network;
      determining a protection level that represents a maximum number of storage unit or repair symbol unit failures before particular data is irrevocably lost on the data storage;
      determining a risk of irrevocable loss for each repair task;
      promoting the one or more repair tasks to be one or more new active repair tasks when a priority value for the one or more repair tasks is higher than a priority value for one or more active repair tasks and enough of the resource budget is available to execute the one or more new active repair tasks when each active repair task is executing; and
      executing each active repair task to repair the one or more storage failures that are associated with the one or more active repair tasks.

22. The network computer of claim 21, further comprising determining each priority value for each repair task in a task list for at least one current storage failure based in part on a comparison of one or more characteristic values that are associated with each repair task in the task list, wherein a lower characteristic value generates a higher priority value over a higher characteristic value.

23. The network computer of claim 21, further comprising promoting the one or more repair tasks to be one or more promoted new active repair tasks when each priority value for the one or more promoted new active repair tasks is higher than each priority value for the one or more active repair tasks, wherein the one or more active repair tasks are demoted to a repair task that has a lower priority value than the priority value for the one or more promoted new active repair tasks until enough of the resource budget is released to execute the one or more promoted new active repair tasks.

24. The network computer of claim 21, further comprising promoting the one or more repair tasks to be one or more promoted new active repair tasks when a remainder of the resource budget enables execution of the one or more repair tasks when the priority value of the one or more repair tasks is lower than the priority value of the one or more active repair tasks requiring other than the remainder to execute.

25. The network computer of claim 21, wherein determining the priority value for each repair task further comprises:
   determining a duration for each repair task;
   determining the priority value based on the duration for each repair task; and
   prioritizing repair tasks based on either longer durations being prioritized over repair tasks with shorter durations or shorter durations being prioritized over repair tasks with longer durations.

26. The network computer of claim 21, wherein the resource budget is dynamically updated based on one or more of, compute processing, network bandwidth, local bandwidth, non-repair related storage task, higher priority file read, storage device throughput, type of erasure encoding, or type of actions to perform each repair task.

* * * * *